(12) United States Patent
Sakuma et al.

(10) Patent No.: US 10,310,018 B2
(45) Date of Patent: Jun. 4, 2019

(54) DEVICE FOR GENERATING A SIMULATION-SIGNAL SERVING AS A COMMAND SIGNAL OF CHARGE/DISCHARGE FOR AN ENERGY-STORAGE SYSTEM, METHOD FOR GENERATING THE SIMULATION SIGNAL, AND NON-TRANSITORY COMPUTER READABLE MEDIUM

(71) Applicant: KABUSHIKI KAISHA TOSHIBA, Tokyo (JP)

(72) Inventors: Masatake Sakuma, Tokyo (JP); Takahiro Yamamoto, Tokyo (JP); Takenori Kobayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 432 days.

(21) Appl. No.: 15/063,960

(22) Filed: Mar. 8, 2016

(65) Prior Publication Data
US 2016/0370432 A1 Dec. 22, 2016

Related U.S. Application Data

(63) Continuation of application No. PCT/JP2015/067510, filed on Jun. 17, 2015.

(51) Int. Cl.
*G01R 31/36* (2019.01)
*H02J 3/32* (2006.01)
(Continued)

(52) U.S. Cl.
CPC ..... *G01R 31/3648* (2013.01); *G01R 31/3865* (2019.01); *H02J 3/32* (2013.01);
(Continued)

(58) Field of Classification Search
CPC .......... B60L 11/1842; B60L 11/182; B60L 11/1824; B60L 11/1844; B60L 11/184;
(Continued)

(56) References Cited

U.S. PATENT DOCUMENTS

| | | | |
|---|---|---|---|
| 4,379,410 A * | 4/1983 | Fritts | G01N 3/32 73/808 |
| 6,016,047 A * | 1/2000 | Notten | G01R 31/3651 320/128 |

(Continued)

FOREIGN PATENT DOCUMENTS

| | | |
|---|---|---|
| JP | 11-273751 | 10/1999 |
| JP | 3683753 | 8/2005 |

(Continued)

OTHER PUBLICATIONS

International Electrotechnical Commission, "Electrical Energy Storage", White Paper, Dec. 2011, pp. 1-91.

*Primary Examiner* — Vinh P Nguyen
(74) *Attorney, Agent, or Firm* — Finnegan, Henderson, Farabow, Garrett & Dunner, L.L.P.

(57) ABSTRACT

According to one embodiment, a simulation-signal generation device includes a charge/discharge-condition acquirer to acquire a charge/discharge condition of an energy-storage system; a signal-characteristic-amount acquirer to acquire a plurality of charge/discharge-signal characteristic amounts for the energy-storage system; a characteristic-signal generation processor to generate a plurality of characteristic signals respectively having the plurality of charge/discharge signal characteristic amounts, based on the plurality of charge/discharge signal characteristic amounts; and a simulation-signal generator to synthesize the plurality of characteristic signals to generate a simulation signal serving as a command signal of charge/discharge for the energy-storage system.

9 Claims, 8 Drawing Sheets

(51) Int. Cl.
*G01R 31/385* (2019.01)
*H02J 3/00* (2006.01)

(52) U.S. Cl.
CPC ......... *H02J 2003/007* (2013.01); *Y02E 60/76* (2013.01); *Y04S 40/22* (2013.01)

(58) Field of Classification Search
CPC .............. B60L 11/185; B60L 2230/30; B60L 2240/527; B60L 2240/529; B60L 2240/662; B60L 2240/72; G01R 31/3624; G06F 19/3481; H02J 2003/007; H02J 3/32
See application file for complete search history.

(56) References Cited

U.S. PATENT DOCUMENTS

| | | | |
|---|---|---|---|
| 6,160,382 A * | 12/2000 | Yoon | G01R 31/3651 320/134 |
| 7,827,007 B2 | 11/2010 | Ito et al. | |
| 9,678,164 B2 * | 6/2017 | Mitsuyama | G01R 31/3606 |
| 2012/0221266 A1 | 8/2012 | Kuroda et al. | |
| 2012/0296482 A1 | 11/2012 | Steven et al. | |
| 2013/0138285 A1 | 5/2013 | Bozchalui et al. | |
| 2014/0070617 A1 | 3/2014 | Detmers et al. | |

FOREIGN PATENT DOCUMENTS

| | | |
|---|---|---|
| JP | 2006-171184 | 6/2006 |
| JP | 2007-292554 | 11/2007 |
| JP | 2011-38928 | 2/2011 |
| JP | 4697105 | 6/2011 |
| JP | 2013-57603 | 3/2013 |
| JP | 5498414 | 5/2014 |
| WO | WO 2013/118265 A1 | 8/2013 |

* cited by examiner

DEVICE FOR GENERATING A SIMULATION-SIGNAL SERVING AS A COMMAND SIGNAL OF CHARGE/DISCHARGE FOR AN ENERGY-STORAGE SYSTEM, METHOD FOR GENERATING THE SIMULATION SIGNAL, AND NON-TRANSITORY COMPUTER READABLE MEDIUM

CROSS REFERENCE TO RELATED APPLICATIONS

This application is a Continuation of International Application No. PCT/JP2015/067510, filed on Jun. 17, 2015, the entire contents of which is hereby incorporated by reference.

FIELD

Embodiments of the present invention relates to a simulation-signal generation device, a simulation-signal generation method, and non-transitory computer readable medium.

BACKGROUND

A stationary large energy-storage system (ESS: Energy Storage System) can be used for electric power quality improvement such as for stabilization of electric power in power grids or local grids of factories, buildings or the like and reduction of frequency variations. Moreover, it is provided with a charge/discharge function to discharge electric power upon peak uses of consumers and charge with excessive electric power. Such an energy storage system is expected to expand a market in the future.

Before starting operation, an energy-storage system is subjected to performance tests to test whether predetermined performance is satisfied. In the performance test, charge/discharge command values assuming an actual operational environment are given. Generally, as the charge/discharge command values given in the test, simulation signals of existing data, constant currents, or combinations of sine waves, rectangular waves, triangle waves, etc. are used; wherein the values that reflect the actual operational environment as much as possible are desired. The characteristics, life, safety, etc. of batteries largely depend on the operational environment. Therefore, if reflection of the actual operational environment is not sufficient, the effects of customizing and safety measures based on test results become poor. Moreover, by obtaining precise test results, the replacement timing of batteries, etc. can be predicted with high precision, and countermeasure plans can be estimated in advance.

The charge/discharge command values in actual operation are superposition of charge/discharge commands of various uses of the energy-storage system. Therefore, the actual charge/discharge command values depend on various environmental factors of a grid to which the energy-storage system is connected and becomes extremely complex. Therefore, in operational tests, it has been difficult to generate charge/discharge command values which are extremely similar to those in the operational environment.

CITATION LIST

Patent Documents

[Patent Document 1] Japanese Patent No. 3683753
[Patent Document 2] Japanese Patent No. 4697105
[Patent Document 3] Japanese Patent No. 5498414

Non-Patent Documents

Non-Patent Document 1

International Electrotechnical Commission Market Strategy Board, Electrical Energy Storage White Paper, December 2011, p. 10-p. 14, the Internet <URL:http://www.iec.ch/whitepaper/pdf/iecWP-energystorage-LR-en.pdf>

DETAILED DESCRIPTION

The embodiments of the present invention aims to generate simulation signals suitable for an operational environment.

According to one embodiment, a simulation-signal generation device includes a charge/discharge-condition acquirer to acquire a charge/discharge condition of an energy-storage system; a signal-characteristic-amount acquirer to acquire a plurality of charge/discharge-signal characteristic amounts for the energy-storage system; a characteristic-signal generation processor to generate a plurality of characteristic signals respectively having the plurality of charge/discharge signal characteristic amounts, based on the plurality of charge/discharge signal characteristic amounts; and a simulation-signal generator to synthesize the plurality of characteristic signals to generate a simulation signal serving as a command signal of charge/discharge for the energy-storage system.

Hereinafter, embodiments of the present invention will be explained with reference to drawings.

First Embodiment

Figure 1:
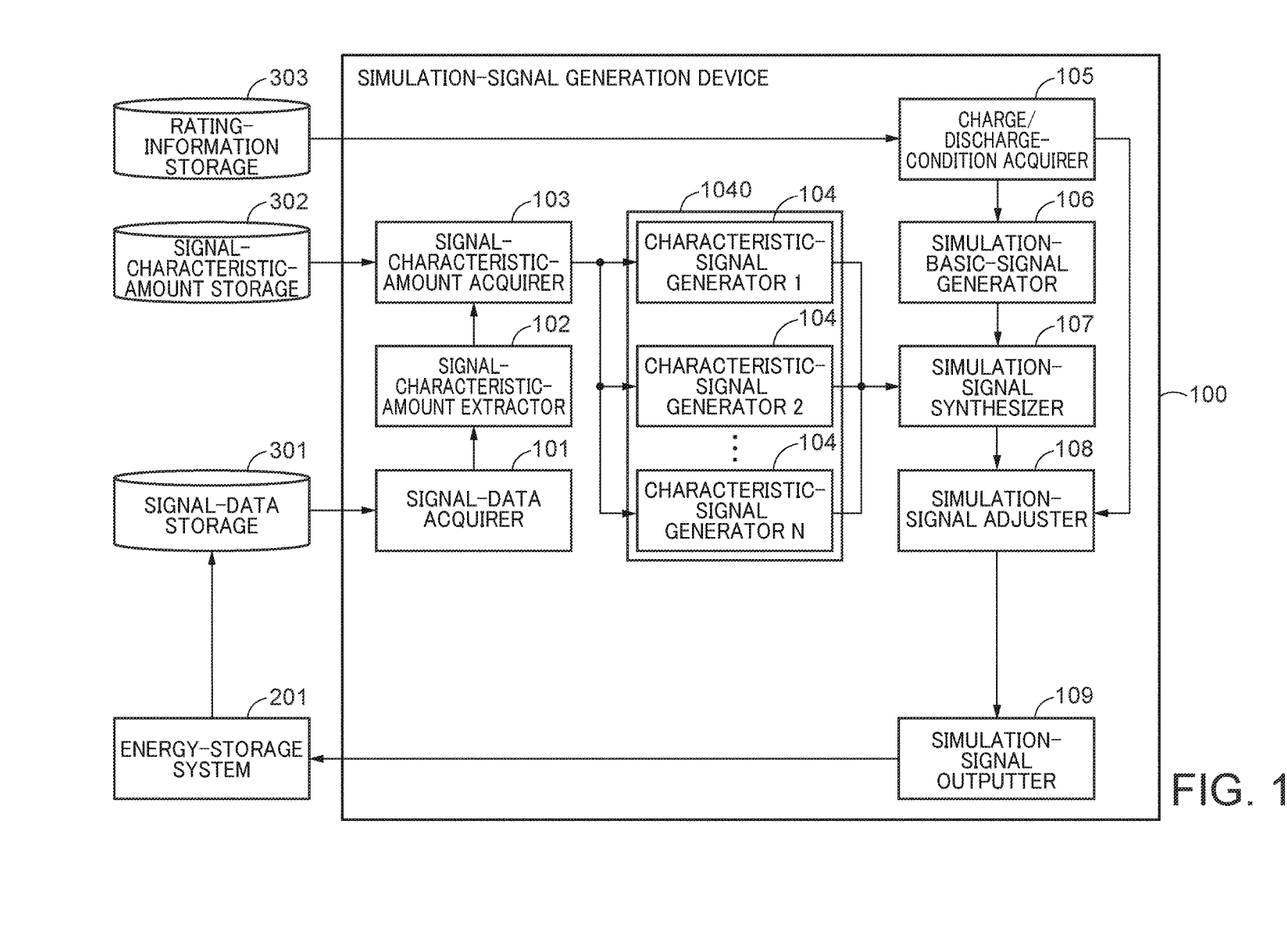
FIG. 1 is a block diagram showing an example of a brief configuration of a simulation-signal generation device according to a first embodiment.

FIG. 1 is a block diagram showing an example of a brief configuration of a simulation-signal generation device according to a first embodiment. A simulation-signal generation device 100 is provided with: a signal-data acquirer 101, a signal-characteristic-amount extractor 102, a signal-characteristic-amount acquirer 103, a characteristic-signal generation processor 1040 including "N" ("N" is an integer of 1 or more) characteristic-signal generator(s) 104, a charge/discharge-condition acquirer 105, a simulation-basic-signal generator 106, a simulation-signal synthesizer 107, a simulation-signal adjuster 108, and a simulation-signal outputter 109.

The simulation-signal generation device 100 is connected to an energy-storage system (battery storage system) 201, a signal-data storage 301, a signal-characteristic-amount storage 302, and a rating-information storage 303.

The simulation-signal generation device 100 generates simulation signals which are to be given to the energy-storage system 201. The simulation signal is a signal represented by a relation between electric power and time and is used as a command signal (charge/discharge command value) for causing the energy-storage system 201 to carry out charge/discharge. Herein, the generated simulation signals are expected to be used as charge/discharge command values in an operational test of the whole energy-storage system before the energy-storage system 201 is installed for actual operation.

The generated simulation signals have the same characteristics as the charge/discharge command values in an expected operational environment of the energy-storage system 201 and are generated at arbitrary data lengths. A generation method will be described later.

The energy-storage system 201 carries out charge/discharge with respect to a connected power grid based on the simulation signals generated by the simulation-signal generation device 100. Interactions between an inverter and a battery pack in the energy-storage system 201, noise currents generated along with operation of the inverter, etc. can be checked by the charge/discharge. Data about the charge-discharge carried out (charge/discharge measurement data) is transmitted to the signal-data storage 301. The charge/discharge measurement data includes information such as voltages, currents, and temperatures of an energy-storage(s). The charge/discharge measurement data can be used by feeding them back to the simulation-signal generation device 100 to improve precision of the simulation signals.

The signal-data storage 301 stores the simulation signals generated in the past and signal data such as charge/discharge measurement data of another battery system(s) in operation. The signal data is data about time-series signals. Signal data "S (t)" at time "t" ("t" is a number of 0 or more) is a set of "n" pieces of data ("n" is an integer of 1 or more) and is expressed as a below equation.

$$S(t)=\{s(T), s(2T), \ldots, s(nT)\} \quad \text{[Mathematical Equation 1]}$$

"T" is a sampling period, and "s(nT)" represents an electric-power value at time nT.

The signal-characteristic-amount storage 302 stores charge/discharge-signal characteristic amounts or control-signal characteristic amounts (hereinafter, referred to as "signal characteristic amounts") for the energy-storage system used in generation of the simulation signals. As the signal characteristic amounts, statistical information on the simulation signals to be generated and usage information on the energy-storage system 201 to which the simulation signals are to be given are used.

The statistical information is information on, for example, probability density functions (PDF: Probability Density Functions) and frequency spectral densities (PSD: Power Spectral Densities). For example, the average values, dispersion values, distortion degrees, peakedness, flatness degrees, etc. of probability density functions and the amplitudes, phases, etc. of frequencies of frequency spectra are used as characteristic amounts.

Examples of the usage information on the energy-storage system 201 are use applications of the energy-storage systems 201 and the proportion of the use applications. The use applications are, for example, frequency adjustment, voltage adjustment, peak shift, and electricity supply reserve. The proportion of the use applications is, for example, the execution time or the number of times of execution of each use application with respect to the entirety or is the proportion of both of them. If the use applications are unusable, the proportion may be "0". Also, it may be information of unit batteries (cells), a battery module, etc. constituting the energy-storage, instead of the whole energy-storage system, a connection configuration thereof, etc.

The reason why the usage information of the energy-storage system 201 is used as the signal characteristic amounts is that it is conceivable that the periodicity of the simulation signals, which are time-series signals, and the use applications, scale, etc. of the energy-storage system 201 can be associated with each other. Generally, the time-series signals are analyzed by being decomposed into long-term fluctuations, periodic fluctuations, and irregular fluctuations. It is known that the fluctuation components of the periodic fluctuations consist of periodic fluctuation components of different periods such as daily fluctuations, monthly fluctuations, and seasonal fluctuations among load fluctuation components viewed from the power grid.

Figure 2:
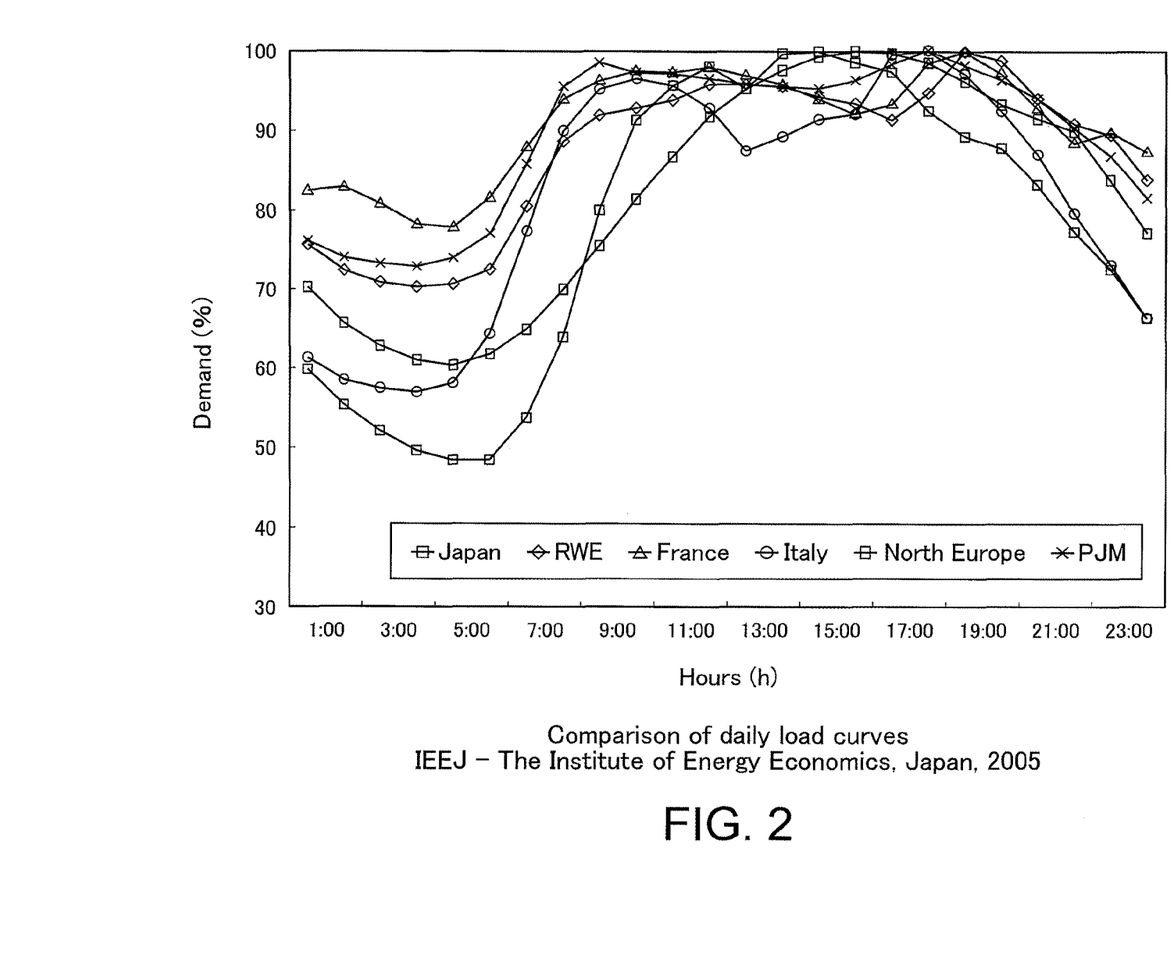
FIG. 2 is a drawing showing an example of daily load curves.

FIG. 2 shows an example of daily load curves showing changes in electric power consumption in a day. In this manner, it is different depending on the scales of countries, areas, and grids, and the values and frequencies of charge/discharge commands are naturally different depending on the role of the energy-storage system connected to the grid and the scale, requirements, etc. of the system.

Figure 3:
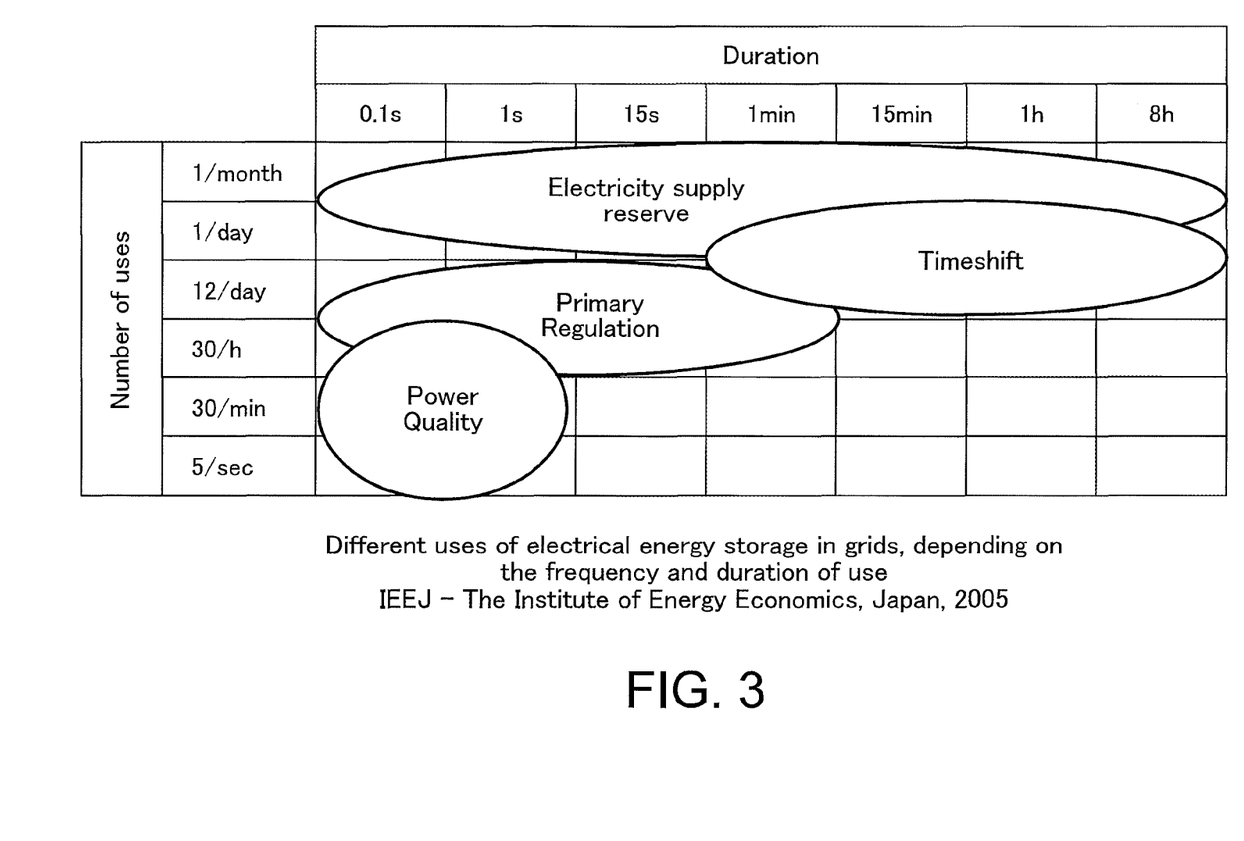
FIG. 3 is a drawing showing a distribution of uses of an energy-storage system and ordered frequencies and charge/discharge durations of the respective uses.

FIG. 3 is a distribution of use applications of the energy-storage system and ordered frequencies and charge/discharge durations of the use applications. In FIG. 3, the roles of the energy-storage system are classified into four types, i.e., electricity supply reserve, time shift, voltage maintenance/adjustment, and frequency maintenance/adjustment. Since the usage frequency and usage time are different depending on the types of the use applications, the charge/discharge command values are also varied depending on the proportions of the use applications carried out.

The rating-information storage 303 stores rating information on the energy-storage system 201. The rating information is information such as specs of the energy-storage system 201. Examples thereof include charge/discharge upper/lower limit values determined only by the performance of the single energy-storage system, an energy storage capacity, consumed electric power, charge time, the number of times of charge, an environment such as a usage temperature, and the types of batteries. Also, it may be information of, for example, the unit batteries (cells) or battery modules constituting the energy-storage in the energy-storage system 201. Also, it may be, for example, a connection configuration thereof.

Next, an internal configuration of the simulation-signal generation device 100 will be explained.

The signal-data acquirer 101 acquires one or more pieces of signal data from the signal data (time-series data) stored in the signal-data storage 301. The acquired signal data is transmitted to the signal-characteristic-amount extractor 102 and is used for generation of the signal characteristic amounts. The acquired signal data is assumed to satisfy operational conditions which are the conditions required for the energy-storage system 201 in actual operation. The operational conditions are determined in consideration of, for example, a location at which the energy-storage system 201 is scheduled to be operated, a surrounding environment, a scheduled frequency of charge/discharge, the type and proportions of the use applications of the energy-storage system 201, and the scale of equipment. Also, it may be information of, for example, the unit batteries (cells) or battery modules constituting the energy-storage instead of the whole energy-storage system 201. Also, it may be, for example, a connection configuration thereof.

The signal-characteristic-amount extractor 102 acquires the signal data from the signal-data acquirer 101 and subjects the signal data to one or more signal process(es), such as a statistical process, to generate one or more signal characteristic amount(s). The number of the type(s) of the signal processes executed by the signal-characteristic-amount extractor 102 is "N" from $f_1(S)$ to $f_N(s)$. If all the signal processes are carried out, "N" sets of signal characteristic amounts are obtained from one set of time-series signal $S(t)$. The signal processes are, for example, averaging, dispersing, or both of them. An average "$\mu$" and a dispersion "V" are obtained by below equations by using "p", which is an integer of 1 or more.

$$\mu = \frac{1}{n}\sum_{p=1}^{n} s(pT) \qquad \text{[Mathematical Equation 2]}$$

$$V = \frac{1}{n}\sum_{p=1}^{n} \{s(pT) - \mu\}^2 \qquad \text{[Mathematical Equation 3]}$$

In accordance with needs, the signal-characteristic-amount extractor 102 may calculate higher order moments such as bias in the probability distribution of signals, the degree of deviation from a normal distribution, etc. and use them as signal-characteristic amounts. The simulation signals to be generated can be adjusted by the signal characteristic amounts.

The signal-characteristic-amount acquirer 103 acquires one or more signal characteristic amount(s) from the signal-characteristic-amount extractor 102. Alternatively, the signal characteristic amounts of the signal data that satisfy the operational conditions may be acquired from the signal-characteristic-amount storage 302. The signal characteristic amounts are individually transmitted to the characteristic-signal generator 104 depending on individual contents thereof.

Note that the function of acquiring the signal characteristic amounts from the signal-characteristic-amount storage 302 and the function of individually transmitting them to the characteristic-signal generator 104 may be separated from each other.

The characteristic-signal generators 104 generate characteristic signals based on the single signal characteristic amounts respectively transmitted from the signal-characteristic-amount acquirer 103. The generated characteristic signal has the signal characteristic amount. Moreover, the generated characteristic signal has a predetermined data length. In order to achieve the predetermined data length, the characteristic-signal generator 104 may carry out processing such as interpolation or extrapolation. The characteristic signals are transmitted to the simulation-signal synthesizer 107.

The charge/discharge-condition acquirer 105 acquires the rating information of the energy-storage system 201 from the rating-information storage 303. The charge/discharge-condition acquirer 105 generates charge/discharge conditions representing restrictions of charge/discharge determined by the acquired rating information. The charge/discharge conditions of the energy-storage system is defined not only by the performance of the inverter, but also defined by the capacity of a grid to which the energy-storage system is installed and connected, an electric power generation system which is separated from the energy-storage system, and devices which consume electric power. In other words, the charge/discharge with respect to the energy-storage system is defined also by external conditions such as the patterns by which the devices and the other system(s) are operated and mismatch between electric power generation and load. The charge/discharge conditions referred to herein include such externally defined conditions. Note that patterns in which charge/discharge is carried out in the form of command values to the energy-storage system can be obtained through simulations which take the charge/discharge conditions into consideration. Then, the charge/discharge conditions serve as restriction conditions to generate the simulation signals. In this process, if the acquired rating information includes the information which is unnecessary for generation of the simulation signals, the charge/discharge conditions may be generated after the information is removed. The data representing the charge/discharge conditions is transmitted to the simulation basic-signal generator 106 and the simulation-signal adjuster 108.

The simulation basic-signal generator 106 generates basic signals for generating the simulation signals. The basic signals are the signals serving as bases of the simulation signals. The simulation basic-signal generator 106 generates the basic signals so as to satisfy the acquired charge/discharge conditions. The basic signal generated based on the charge/discharge conditions can be considered as one of the plurality of above described characteristic signals. The basic signals may be the signals which are distributed by a uniform distribution or a Gaussian distribution. Also, for example, there is a method in which, after uniform-distribution random numbers of the signals which satisfy the charge/discharge conditions are generated, normal-distribution random numbers generated by, for example, a Box-Muller's method are synthesized. The generated basic signals are transmitted to the simulation-signal synthesizer 107.

The simulation-signal synthesizer 107 generates the simulation signals based on the one or more characteristic signal(s) from the one or more characteristic-signal generator(s) 104 and the basic signal. Meanwhile, as the basic signal, the signal data stored in the signal-data storage 301 may be used instead of the basic signal generated by the simulation basic-signal generator 106. A generation method is, for example, a method of synthesizing by superimposing the characteristic signal(s) with respect to the basic signals. An embodiment in which the simulation signal is generated by synthesizing the plurality of characteristic signals without using the basic signal is also possible. The synthesized simulation signal is transmitted to the simulation-signal adjuster 108.

The simulation-signal adjuster 108 confirms whether the charge/discharge conditions generated by the charge/discharge-condition acquirer 105 are satisfied with respect to the synthesized simulation signal. Moreover, in accordance with needs, the simulation signal is adjusted. For example, adjustment such as multiplying the value of the simulation signal by a predetermined coefficient is carried out. The adjusted simulation signal is transmitted to the simulation-signal outputter 109. Note that the form of the simulation signal represents the relation between time and an electric-power value, and it is assumed that this can be interpreted by the energy-storage system as a command value of charge/ discharge corresponding to time; however, in accordance with needs, it may be converted to a form that can be interpreted by the energy-storage system.

The simulation-signal outputter 109 outputs the simulation signal, which is from the simulation-signal adjuster 108, to the energy-storage system 201.

This is a brief configuration of the simulation-signal generation device according to the first embodiment.

Figure 4:
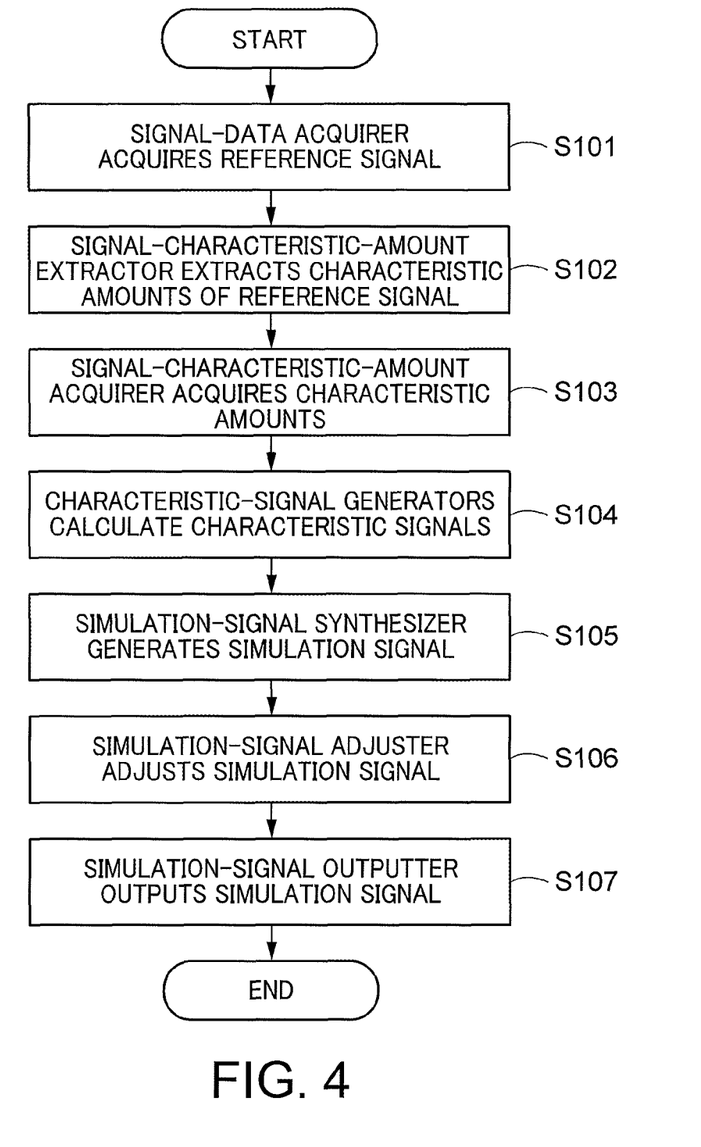
FIG. 4 is a flow chart of simulation signal generation by FFT and inverse FFT.

Next, an example of a method in which the simulation-signal generation device 100 actually generates the simulation signal will be explained. FIG. 4 is a flow chart of simulation signal generation by FFT (discrete fast Fourier transform) and inverse FFT.

The signal-data acquirer 101 acquires at least one piece of signal data (referred to as a reference signal) from the plurality of pieces of signal data stored in the signal-data storage 301 (S101).

The acquired reference signal(s) may be specified by a user or selected by the signal-data acquirer 101. As a selection method, the data of an energy storage system with which the operational environment, the purposes of use applications, ratings, etc. of an energy storage system to be tested match may be selected.

The signal-characteristic-amount extractor 102 extracts the characteristic amount (signal characteristic amount) of the signal from the reference signal acquired by the signal-data acquirer 101 (S102).

It is assumed that the characteristic amounts to be extracted are determined in advance. In this case, it is assumed that the signal-characteristic-amount extractor 102 calculates a frequency spectrum or a phase spectrum by, for example, FFT or an autoregressive model and then calculates the signal characteristic amounts about the frequency spectrum or the phase spectrum.

The signal-characteristic-amount acquirer 103 allocates the plurality of signal characteristic amounts, which are acquired from the signal-characteristic-amount extractor 102, respectively to the characteristic-signal generators 104 (S103).

The destinations of allocation are determined in advance depending on the signal characteristic amounts to be input.

If a particular signal characteristic amount is to be added to the simulation signal, for example, if the simulation signal to be generated is desired to have a signal characteristic amount different from the reference signal, the signal-characteristic-amount acquirer 103 may acquire the signal characteristic amount from the signal-characteristic-amount storage 302.

The characteristic-signal generators 104 calculate characteristic signals based on the respectively acquired signal characteristic amounts (S104). If there are "N" signal characteristic amounts, "N" characteristic signals are generated.

In the present flow, with respect to the given frequency spectrum or phase spectrum, each of the characteristic-signal generators 104 carries out inter/extra-potation so as to obtain a data length determined in advance and then carries out discrete inverse Fourier transform. As a result, "N" characteristic signals ("N" pieces of time-series data) are generated.

The simulation-signal synthesizer 107 synthesizes the plurality of characteristic signals generated by the characteristic-signal generators 104 and the basic signal from the simulation basic-signal generator 106 (S105).

In the present flow, the basic signal generated by the simulation basic-signal generator 106 is not used, and only the characteristic signals are synthesized. As a result of this synthesis, the simulation signal has the characteristics of the reference signal.

The simulation-signal adjuster 108 adjusts the generated simulation signal (S108), and the simulation-signal outputter 109 outputs the simulation signal (S109). The output simulation signal is transmitted to the energy storage system. Hereinabove, the flow of the simulation signal generation is finished.

Figure 5:
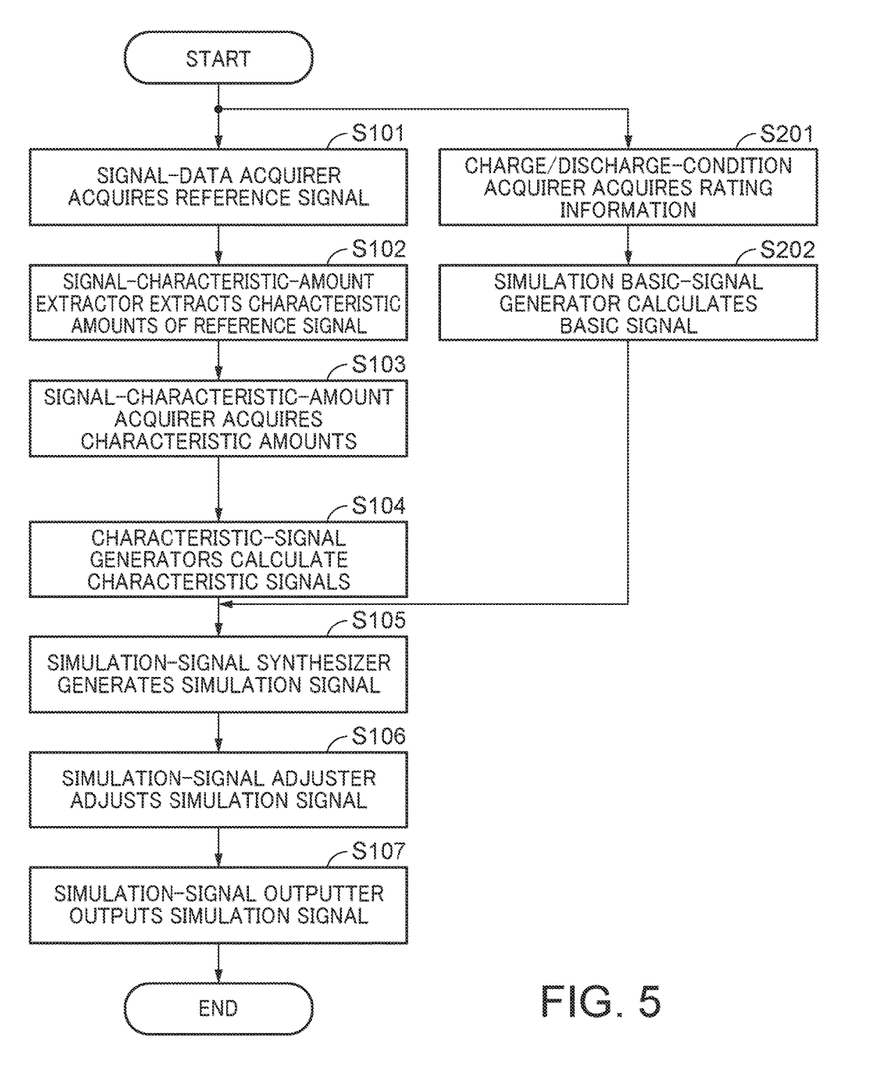
FIG. 5 is a flow chart of simulation signal generation using a basic signal.

Next, a flow of generating the simulation signal by using the basic signal generated by the simulation basic-signal generator 106 will be explained. FIG. 5 is a flow chart of simulation signal generation using the basic signal. The present flow generates a new simulation signal having characteristics similar to the basic signal. The point that a process of generating the basic signal is added and detailed processes are different from the above described flow.

The processing of the signal-data acquirer 101 is the same as that of the above described flow (S101).

It is assumed that the signal-characteristic-amount extractor 102 calculates a frequency spectrum density (PSD) and a probability density function (PDF) of the reference signal and then calculates the signal characteristic amounts about PSD and PDF.

The processing of the signal-characteristic-amount acquirer 103 is the same as that of the above described flow (S103).

The characteristic-signal generators 104 calculate characteristic signals based on the signal characteristic amounts about the probability density function (PDF) (S104). Specifically, after a graph of uniform distribution is generated, random numbers are generated, and a time-series graph that matches the signal characteristic amounts about the PDF is generated.

Moreover, one of the characteristic-signal generators 104 generates a frequency filter, which simulates the frequency spectrum shape of the reference signal, based on the frequency spectrum density (PSD). This is for a reason that, since the time-series graph generated based on the random numbers in step S104 is random on the frequency spectrum, filtering by, for example, a FIR filter or an IIR filter is required.

The charge/discharge-condition acquirer 105 acquires the rating information from the rating-information storage 303 (S201).

It is assumed that, for example, the number of the energy storage system to be tested is given to the charge/discharge-condition acquirer 105 in advance, and, the rating information to be acquired may be determined, for example, by the number.

The simulation basic-signal generator 106 generates the basic signal based on the acquired characteristic amounts and the rating information acquired from the rating-information storage 303 (S202).

The type of the basic signal to be generated may be determined in advance or may be determined based on the characteristic amounts of the reference signal.

The simulation-signal synthesizer 107 synthesizes the plurality of characteristic signals generated by the characteristic-signal generators 104 and the basic signal from the simulation basic-signal generator 106 (S107).

The processing thereafter is the same as that of the flow chart of the simulation signal generation by FFT and inverse FFT (see FIG. 4). Hereinabove, the flow of the simulation signal generation using the basic signal is finished.

Figure 6:
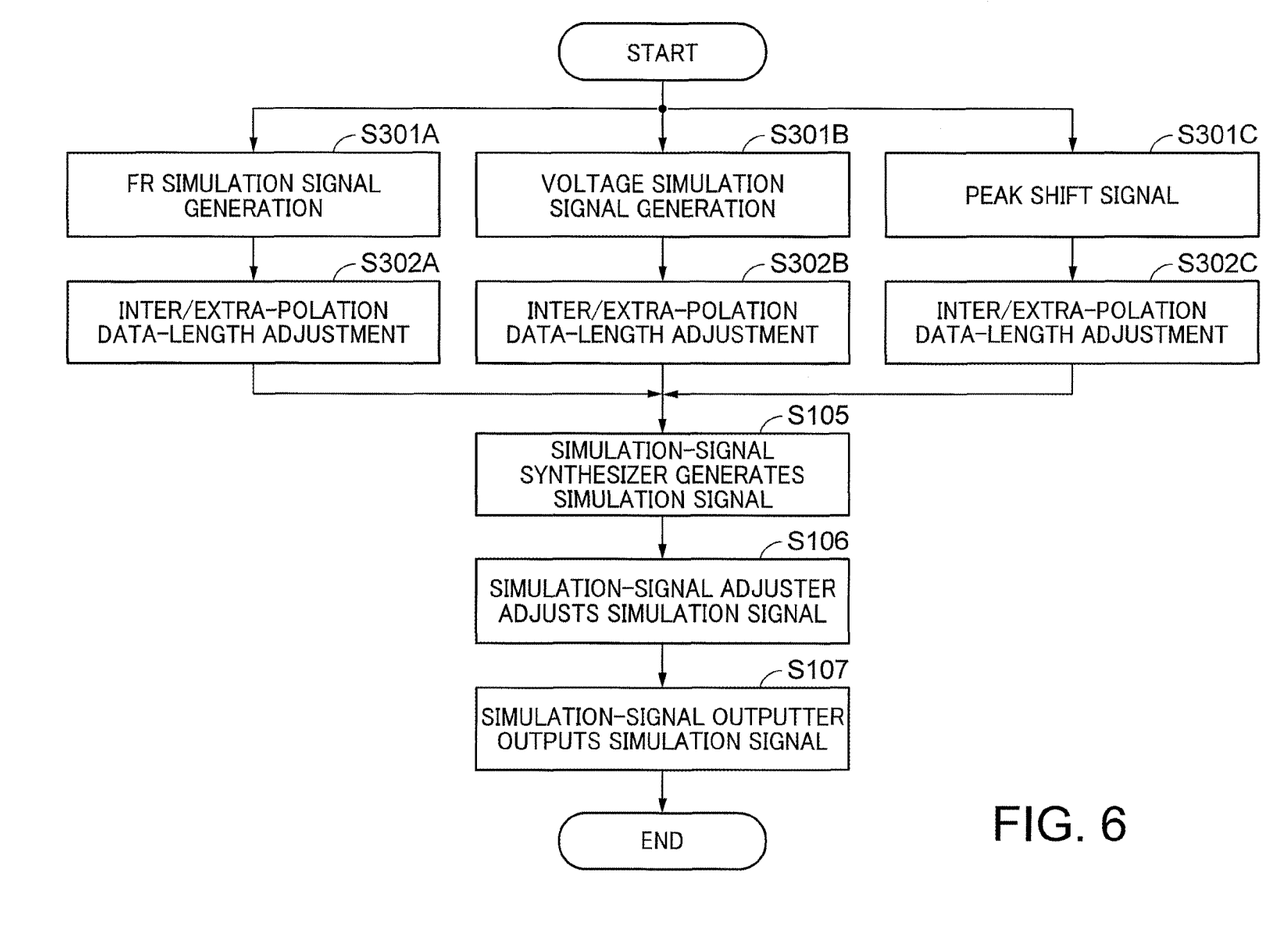
FIG. 6 is a flow chart of superimposed simulation signal generation.

Next, a method of generating a simulation signal on which simulation signals of respective use applications are superimposed will be explained. FIG. 6 is a flow chart of superimposed simulation signal generation.

If there are a plurality of use applications of the energy storage system, the simulation signal is generated by superimposing a plurality of simulation signals generated respectively for the use applications. Hereinafter, the simulation signals generated respectively for use applications will be referred to as use-corresponding simulation signals, and the simulation signal generated by superimposing the plurality of use-corresponding simulation signals will be referred to as a superimposed simulation signal.

A case in which the energy-storage system is used for three types of use applications, i.e., FR (frequency fluctuation reduction), voltage control, and peak shift is expected. The signal-data acquirer 101 acquires reference signals of the respective use applications of the above described three types (S301A, S301B, S301C).

The processing of the signal-data acquirer 101, the signal-characteristic-amount extractor 102, and the signal-characteristic-amount acquirer 103 is the same as the processing of the simulation signal generation and is therefore omitted.

Before carrying out the inverse Fourier transform, the characteristic-signal generators 104 carry out interpolation processing (S302A, S302B, S302C) and adjust data lengths.

The response speed (time constant) of the energy storage system with respect to the charge/discharge commands is different depending on the use applications of the energy storage system. Therefore, it is predicted that the time intervals of the time-series data of the use-corresponding simulation signals are also different. Therefore, if the use-corresponding simulation signals are superimposed without change, the time intervals of the time-series data of the superimposed simulation signal become non-uniform. Moreover, if the superimposed simulation signal like this is subjected to interpolation, the signal characteristic amounts are lost. Therefore, in order to generate the superimposed simulation signal to which the signal characteristic amounts are appropriately reflected, the use-corresponding simulation signals have to be subjected to interpolation processing before superimposition to uniformize the time intervals of the time-series data of the simulation signals in advance.

The characteristic-signal generators 104 subjects the use-corresponding simulation signals of the three types, i.e., FR, voltage control, and peak shift to interpolation processing to uniformize the number of the time-series data among the three types. In the interpolation, at the time when the time-series data of the other use-corresponding simulation signals are present, data having a value of 0 is interpolated. However, if there is the time-series data of itself at the same time, the interpolation is not carried out. After data is added by a required number in this manner, a FIR filter is applied in order to retain the signal characteristic amounts.

Note that the interpolation may use methods such as first-order interpolation (linear interpolation), second-order interpolation (parabolic interpolation), and zero-order interpolation (nearest interpolation).

The processing of the characteristic-signal generators 104, the simulation-signal synthesizer 107, the simulation-signal adjuster 108, and the simulation-signal outputter 109 thereafter is the same as the processing of the simulation signal generation and is therefore omitted. Hereinabove, the flow of the superimposed simulation signal generation is finished. In this manner, the superimposed simulation signal can be generated by superimposing the use-corresponding simulation signals.

As described above, according to the first embodiment, as well as the case of actual operation, the simulation signals similar to the charge/discharge command values, which are complexed by various uses such as frequency control, voltage control, and peak shift, are generated and applied to the energy-storage system, and, as a result, the situation in operation can be realized. Therefore, in a test before operation, test results with high reliability can be obtained.

Moreover, by using the charge/discharge data acquired in the test as references and comparing that with charge/discharge data in future operation, state changes, deterioration progresses, etc. of the energy-storage system can be estimated without stopping or detaching the energy-storage system.

Second Embodiment

Figure 7:
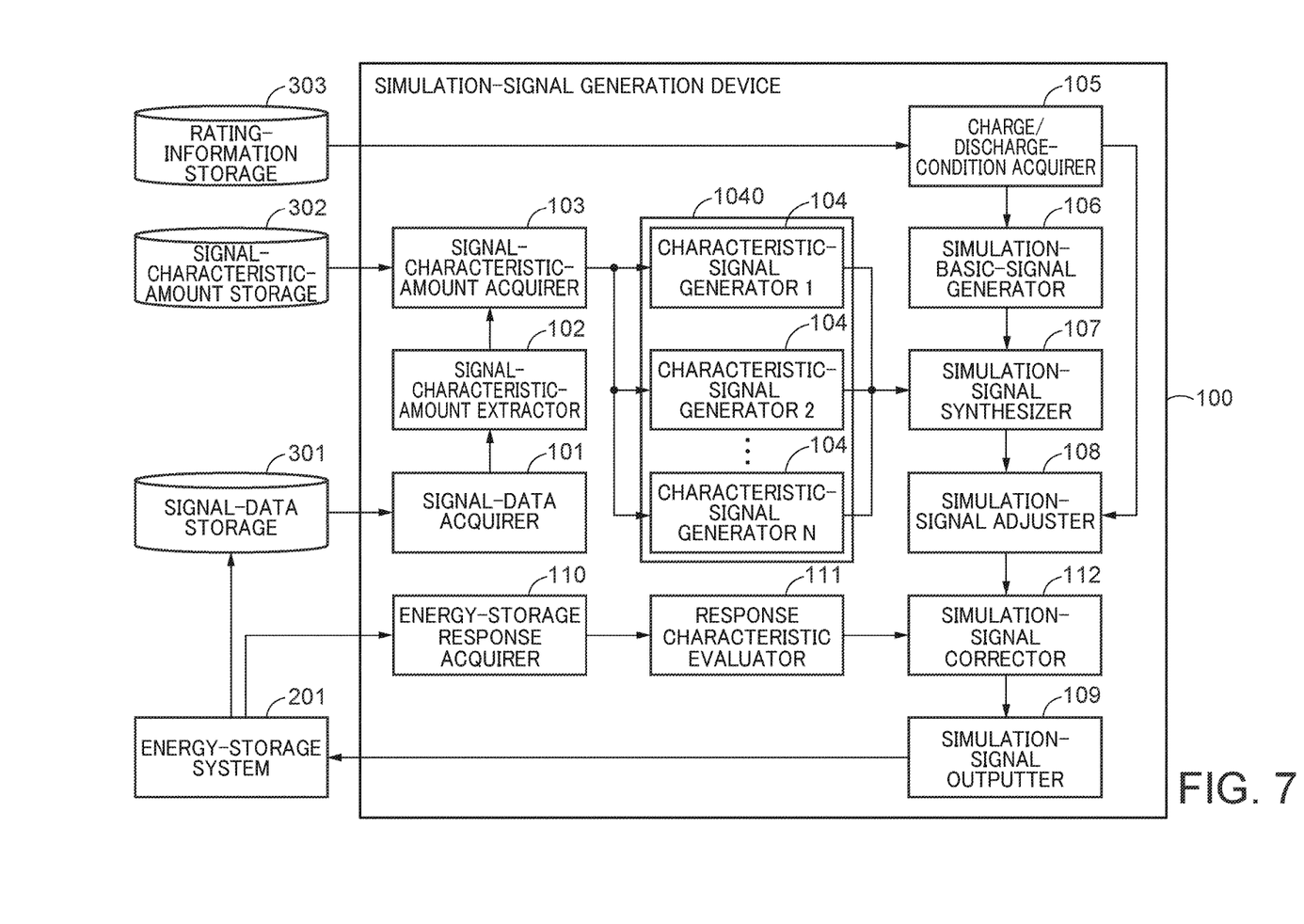
FIG. 7 is a block diagram showing an example of a brief configuration of a simulation-signal generation device according to a second embodiment.

FIG. 7 is a block diagram showing a brief configuration of a simulation-signal generation device according to a second embodiment. In the second embodiment, with respect to the first embodiment, an energy-storage response acquirer 110, a response characteristic evaluator 111, and a simulation-signal corrector 112 are added. The response characteristic evaluator 111 is included in a characteristic-signal generator 113, but may be disposed outside the characteristic-signal generator 113.

The energy-storage response acquirer 110 acquires responses from the energy-storage system 201. The responses are charge/discharge measurement data measured when the energy-storage system 201 carries out charge/discharge in accordance with the simulation signals. In other words, the results with respect to the simulation signals are fed back from the energy-storage system 201. The energy-storage response acquirer 110 selects or calculates data (response data) for evaluating the simulation signals from the fed-back charge/discharge measurement data. It is assumed that a method of selecting or calculating the response data is determined in advance.

For example, as a response of the energy-storage, the energy-storage response acquirer 110 acquires the data of a current value, a voltage value, and a temperature in charge/discharge of the energy-storage. The energy-storage response acquirer 110 reads, for example, response data corresponding to the acquired current value, voltage value, and temperature data or a calculation expression of the response data for example by a tabular file retained in advance and then calculates the response data. Note that the response data may be stored in, for example, the signal-data storage and be acquired by the energy-storage response acquirer 110 in accordance with needs.

Note that, in FIG. 7, the energy-storage response acquirer 110 is stored in the simulation-signal generation device 100, but may be outside thereof.

The response-characteristic evaluator 111 evaluates the characteristics of the response data and judges necessity/unnecessity of correction. The judgement is carried out based on measurement values such as the voltage, current, and temperature included in the response data. The simulation signal is determined based on conditions such as frequency fluctuation reduction of a power grid, an electricity distribution grid, or the like to which the energy-storage system is scheduled to be installed. However, there is a case in which various operational conditions such as a rated capacity, a rated current, and an operational temperature of the energy-storage has not been taken into consideration. Therefore, if application of the simulation signal is continuously carried out, the energy-storage system may deviate from the operational conditions, and correction is required. For example, whether the characteristics or measurement values of the response data or both of them satisfy conditions according to, for example, threshold values or effective ranges is judged. If the conditions are not satisfied, it is evaluated that the output value of the simulation signal requires correction. Also, a correction method or a correction mode may be selected and included in the evaluation result.

Based on the evaluation result from the response characteristic evaluator 111, the simulation-signal corrector 112 carries out a correction process with respect to the adjusted simulation signal from the simulation-signal adjuster 108. The method of correction may be determined in advance depending on the contents of correction or may be acquired from the response characteristic evaluator 111. The corrected amount may be calculated by the simulation-signal corrector 112. The simulation signal to which the correction process has been applied is transmitted to the simulation-signal outputter 109.

For example, if the integration value of charge/discharge of the energy-storage system up to a present point deviates from or may deviate from a range determined in advance, a correction of multiplying the simulation signal by a coefficient determined in advance to reduce a fluctuation range may be carried out. Alternatively, the simulation-signal corrector 112 may calculate the coefficient value which does not cause deviation from the range. Other than that, a correction of adding a certain positive or negative value to the charge/discharge value as an offset, a correction of adding an offset of a monotonic increase or a monotonic decrease with respect to time elapse, etc. are conceivable. Also, for example, if the internal temperature of the energy-storage system is increased by charge/discharge and exceeds a limit temperature determined in advance, the simulation-signal corrector 112 may temporarily stop the test.

Other parts are the same as the first embodiment.

Figure 8:
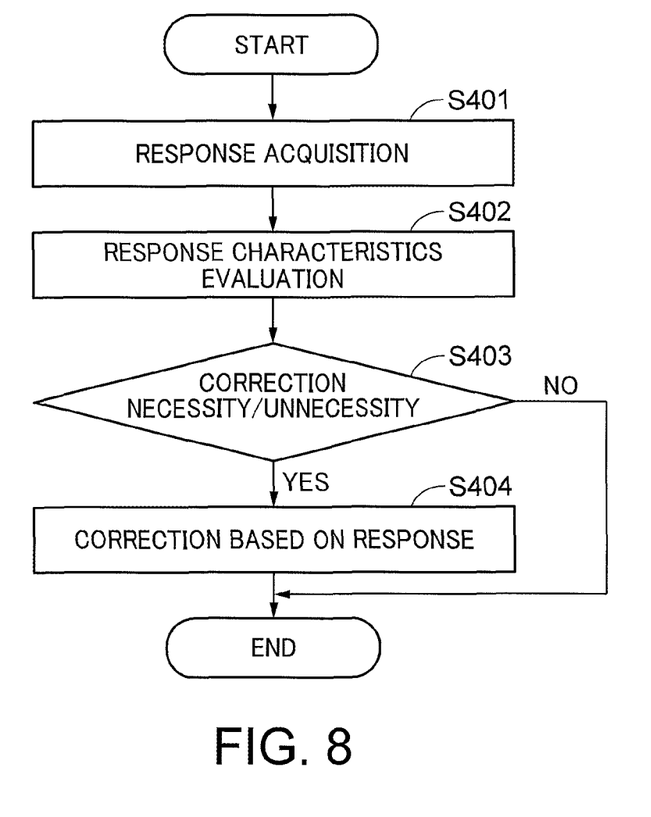
FIG. 8 is a flow chart of a feedback process.

FIG. 8 is a flow chart of a feedback process by the parts added in the second embodiment. The present flow chart is started when the response from the energy storage system is received by the battery-response acquirer.

The energy-storage response acquirer 110 selects or calculates response data from the charge/discharge measurement data fed back from the energy-storage system 201 (S401).

The response data is transmitted to the response characteristic evaluator 111.

The response characteristic evaluator 111 evaluates the characteristics of the response data acquired from the energy-storage response acquirer 110 and judges the necessity/unnecessity of correction (S402, S403).

It is assumed that a judgement criterion is determined in advance. The evaluation result is transmitted to the simulation-signal corrector 112 together with the response data.

The simulation-signal corrector 112 carries out a correction process based on the evaluation result of the response characteristic evaluator 111 (S404). The simulation signal to which the correction process has been applied is transmitted to the simulation-signal outputter 109.

The process thereafter is the same as the flow chart of the first embodiment. Hereinabove, the flow of the feedback process is finished.

As described above, according to the second embodiment, more reliable test results can be obtained by feeding back the results of charge/discharge according to the generated simulation signal.

Note that the simulation-signal generation devices of the embodiments can be realized by, for example, using a general-purpose computer device as basic hardware. More specifically, they can be realized by causing a processor mounted on the above described computer device to execute programs. In this process, the simulation-signal generation device can be realized by installing the above described program in the computer device in advance or by storing the above described program in various storage media or distributing the above described program via a network and appropriately installing the program in the computer device. Also, the storages in the simulation-signal generation device can be realized by appropriately using a memory, a hard disk, or a storage medium such as a CD-R, CD-RW, DVD-RAM, or DVD-R built in or externally attached to the above described computer device.

The present invention is not limited to the above described embodiments as they are, and constituent elements can be substantiated with deformation within a range not deviating from the gist thereof in a practical phase. Various inventions can be formed by appropriate combinations of the plurality of constituent elements disclosed in the above described embodiments. For example, some constituent elements can be deleted from all the constituent elements shown in the embodiments, and the elements across the different embodiments can be appropriately combined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

REFERENCE SYMBOLS LIST

100 SIMULATION-SIGNAL GENERATION DEVICE
101 SIGNAL-DATA ACQUIRER
102 SIGNAL-CHARACTERISTIC-AMOUNT EXTRACTOR
103 SIGNAL-CHARACTERISTIC-AMOUNT ACQUIRER
1040 CHARACTERISTIC-SIGNAL GENERATION PROCESSOR
104 CHARACTERISTIC-SIGNAL GENERATOR(S)
105 CHARGE/DISCHARGE-CONDITION ACQUIRER
106 SIMULATION BASIC-SIGNAL GENERATOR
107 SIMULATION-SIGNAL SYNTHESIZER
108 SIMULATION-SIGNAL ADJUSTER
109 SIMULATION-SIGNAL OUTPUTTER
110 ENERGY-STORAGE RESPONSE ACQUIRER
111 RESPONSE CHARACTERISTIC EVALUATOR
112 SIMULATION-SIGNAL CORRECTOR
201 ENERGY-STORAGE SYSTEM
301 SIGNAL-DATA STORAGE
302 SIGNAL-CHARACTERISTIC-AMOUNT STORAGE
303 RATING-INFORMATION STORAGE

The invention claimed is:

1. A simulation-signal generation device comprising:
a signal-characteristic-amount acquirer to acquire a plurality of charge/discharge-signal characteristic amounts corresponding to characteristics of a charge/discharge command signal for an energy-storage system;
a characteristic-signal generation processor to generate a plurality of characteristic signals respectively having the plurality of charge/discharge signal characteristic amounts, based on the plurality of charge/discharge signal characteristic amounts; and a simulation-signal generator to synthesize the plurality of characteristic signals to generate a simulation signal of the command signal.

2. The simulation-signal generation device according to claim 1, further comprising:

a signal-data acquirer to acquire a charge/discharge signal satisfying an operational condition of the energy-storage system from among a plurality of charge/discharge signals measured in at least one other energy-storage system; and a signal-characteristic-amount extractor to extract one or more of the plurality of charge/discharge-signal characteristic amounts from the charge/discharge signal acquired by the signal-data acquirer, wherein the signal-characteristic-amount acquirer acquires one or more of the plurality of charge/discharge-signal characteristic amounts extracted by the signal-characteristic-amount extractor.

3. The simulation-signal generation device according to claim 2, wherein the signal-characteristic-amount extractor extracts information on a frequency spectrum and a phase spectrum of the charge/discharge signal as the charge/discharge-signal characteristic amount.

4. The simulation-signal generation device according to claim 1, wherein the plurality of charge/discharge-signal characteristic amounts includes a plurality of arbitrary pieces of: information on a probability density function, information on a frequency spectrum density, information on a use application of the energy-storage system, and information on at least one of averaging and dispersing.

5. The simulation-signal generation device according to claim 1, further comprising:

a charge/discharge-condition acquirer to acquire a charge/discharge condition of an energy-storage system; and a simulation basic-signal generator to synthesize a plurality of signals to thereby generate a basic signal, the signals being generated by random numbers based on a uniform distribution or a Gaussian distribution of signals which satisfy the charge/discharge condition of the energy-storage system, wherein the simulation-signal generator synthesizes the plurality of characteristic signals and the basic signal to generate the simulation signal.

6. The simulation-signal generation device according to claim 1, further comprising:

an energy-storage response acquirer to acquire charge/discharge measurement data measured when the energy-storage system carries out charge/discharge in accordance with the simulation signal;

a response characteristic evaluator to evaluate a characteristic of the charge/discharge measurement data; and a simulation-signal corrector to correct the simulation signal generated by the simulation-signal generator in accordance with an evaluation result of the response characteristic evaluator.

7. The simulation-signal generation device according to claim 6, wherein the response characteristic evaluator judges whether the charge/discharge measurement data satisfies an operational condition serving as a condition required for the energy-storage system in operation; and, when the charge/discharge measurement data does not satisfy the operational condition, the simulation-signal corrector corrects the simulation signal.

8. A simulation-signal generation method comprising:

acquiring a plurality of charge/discharge-signal characteristic amounts corresponding to characteristics of a charge/discharge command signal for an energy-storage system;

generating a plurality of characteristic signals respectively having the plurality of charge/discharge signal characteristic amounts, based on the plurality of charge/discharge signal characteristic amounts; and synthesizing the plurality of characteristic signals to generate a simulation signal of the command signal.

9. A non-transitory computer readable medium having computer program which causes a computer to perform processing comprising:

acquiring a plurality of charge/discharge-signal characteristic amounts corresponding to characteristics of a charge/discharge command signal for an energy-storage system;

generating a plurality of characteristic signals respectively having the plurality of charge/discharge signal characteristic amounts, based on the plurality of charge/discharge signal characteristic amounts; and synthesizing the plurality of characteristic signals to generate a simulation signal of the command signal.

* * * * *